US012099118B2

(12) United States Patent
Lesso et al.

(10) Patent No.: US 12,099,118 B2
(45) Date of Patent: Sep. 24, 2024

(54) OBJECT DETECTION CIRCUITRY

(71) Applicant: Cirrus Logic International Semiconductor Ltd., Edinburgh (GB)

(72) Inventors: John P. Lesso, Edinburgh (GB); Claire Motion, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 358 days.

(21) Appl. No.: 17/582,128

(22) Filed: Jan. 24, 2022

(65) Prior Publication Data

US 2022/0244378 A1 Aug. 4, 2022

Related U.S. Application Data

(60) Provisional application No. 63/143,201, filed on Jan. 29, 2021.

(30) Foreign Application Priority Data

Feb. 18, 2021 (GB) ..................................... 2102286

(51) Int. Cl.
*G01S 15/52* (2006.01)
*G01R 19/00* (2006.01)
*G01S 7/527* (2006.01)

(52) U.S. Cl.
CPC ........ *G01S 15/523* (2013.01); *G01R 19/0038* (2013.01); *G01S 7/527* (2013.01)

(58) Field of Classification Search
CPC .... G01S 15/523; G01S 7/527; G01S 7/52004; G01S 15/931; G01S 7/523; G01S 7/52; G01R 19/0038
USPC .................... 324/76.11, 74, 750.01
See application file for complete search history.

(56) References Cited

U.S. PATENT DOCUMENTS

| | | | |
|---|---|---|---|
| 4,785,664 A | 11/1988 | Reebs | |
| 5,198,713 A | 3/1993 | Suzuta | |
| 9,036,453 B2* | 5/2015 | Suzuki | G01S 7/5276 367/99 |
| 11,442,155 B2* | 9/2022 | Hustava | G01S 15/931 |
| 11,828,885 B2* | 11/2023 | Peso Parada | H04B 11/00 |
| 2015/0367751 A1* | 12/2015 | Lamesch | B60N 2/002 297/180.12 |
| 2017/0299718 A1 | 10/2017 | Kydar | |
| 2018/0160226 A1 | 6/2018 | Hustava et al. | |
| 2018/0364341 A1 | 12/2018 | Ding et al. | |
| 2019/0079187 A1* | 3/2019 | Tsuji | G01S 15/10 |
| 2019/0305542 A1* | 10/2019 | McBrien | G01D 3/08 |
| 2019/0377074 A1* | 12/2019 | Sugae | G01S 15/42 |
| 2020/0256969 A1 | 8/2020 | Hyeon | |
| 2020/0292684 A1* | 9/2020 | Passoni | G01S 7/52004 |

(Continued)

FOREIGN PATENT DOCUMENTS

JP H09101366 A 4/1997

OTHER PUBLICATIONS

Combined Search and Examination Report under Sections 17 and 18(3), UKIPO, Application No. GB2102286.8, mailed Oct. 26, 2021.

(Continued)

*Primary Examiner* — Giovanni Astacio-Oquendo
(74) *Attorney, Agent, or Firm* — Jackson Walker L.L.P.

(57) ABSTRACT

Circuitry comprising excitation circuitry for supplying a transducer with an excitation signal to generate a detection signal and current monitor circuitry for monitoring current through the transducer.

21 Claims, 9 Drawing Sheets

(56) References Cited

U.S. PATENT DOCUMENTS

2022/0254980 A1\* 8/2022 Lesso .................... G01S 7/527
2024/0094385 A1\* 3/2024 Hustava ............. G01S 7/52004

OTHER PUBLICATIONS

International Search Report and Written Opinion of the International Searching Authority, International Application No. PCT/GB2022/050159, mailed Apr. 5, 2022.
Examination Report under Section 18(3), UKIPO, Application No. GB2102286.8, mailed Mar. 14, 2024.

\* cited by examiner

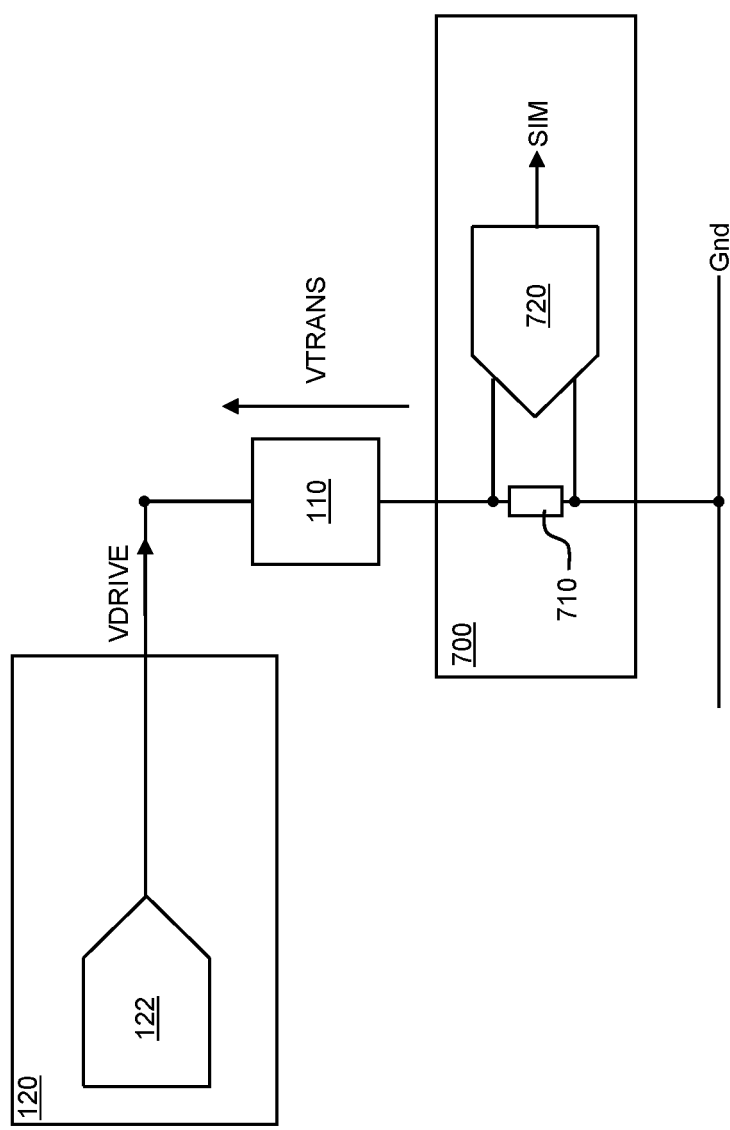

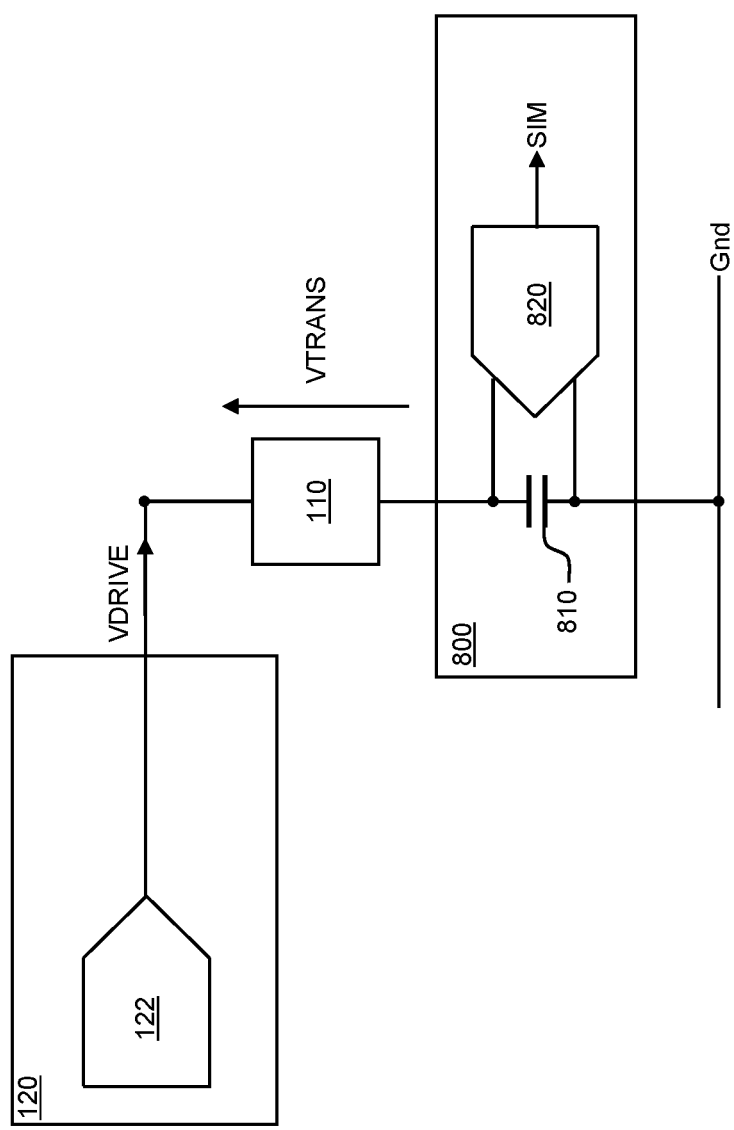

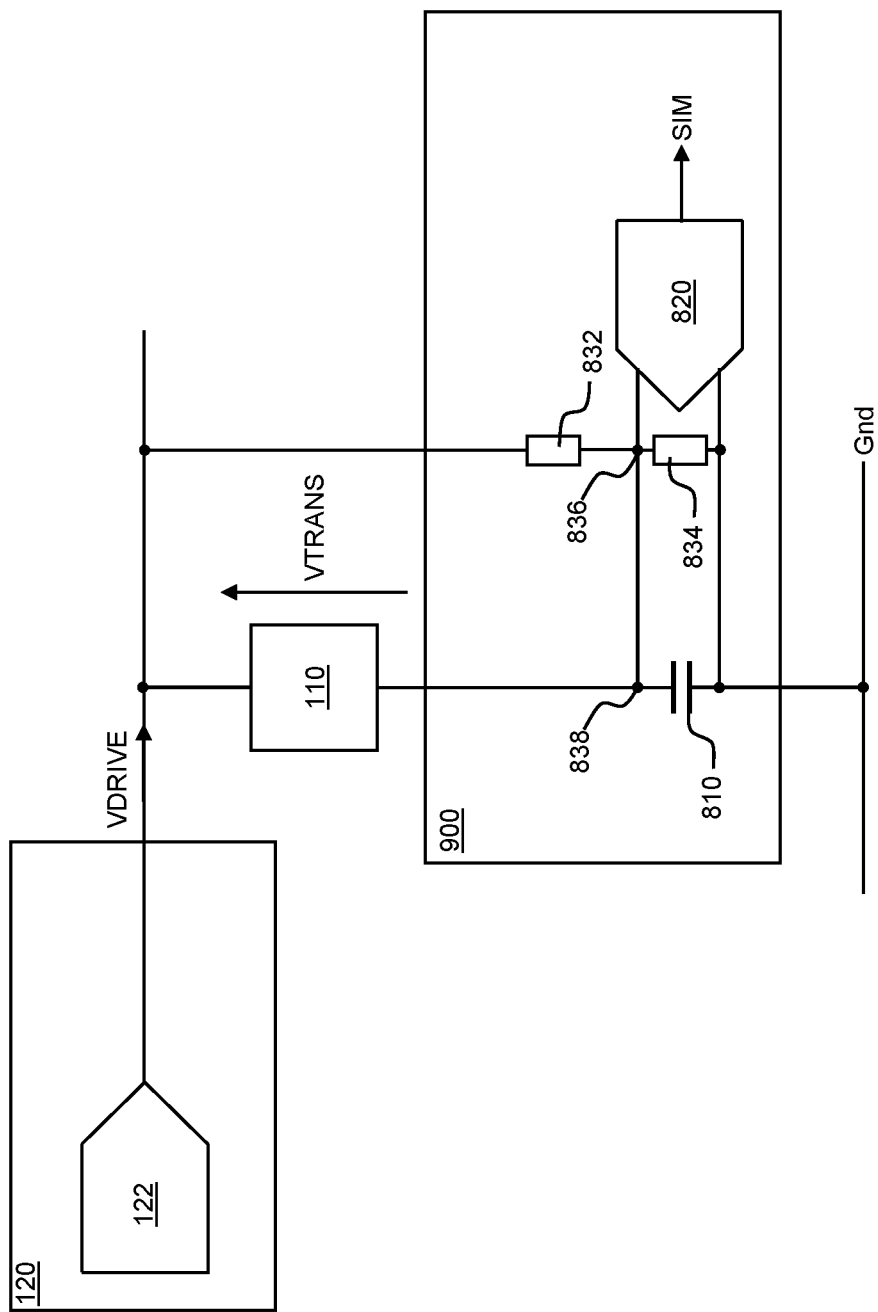

OBJECT DETECTION CIRCUITRY

The present disclosure claims priority to U.S. Provisional Patent Application Ser. No. 63/143,201, filed Jan. 29, 2021, and United Kingdom Patent Application No. 2102286.8, filed Feb. 18, 2021, each of which is incorporated by reference herein in its entirety.

FIELD OF THE INVENTION

The present disclosure relates to the field of object detection.

BACKGROUND

The use of ultrasonic signals for object detection and range finding has become commonplace. For example, parking sensors for vehicles typically use ultrasonic transducers to transmit and receive ultrasonic signals. By detecting the time between transmission of a signal and reception of a reflected signal, the distance between the transducer and an obstacle can be estimated, calculated or otherwise determined, and appropriate warnings can be issued to a driver of the vehicle. In another example, ultrasonic transducers may be used in "kick sensor" systems, to detect movement of a user's foot in a particular area, e.g. beneath the rear of a vehicle. On detection of the user's foot, a compartment of the vehicle may be unlocked and opened, thus allowing hands-free access to a luggage compartment, for example.

SUMMARY

According to a first aspect, the invention provides circuitry comprising:
 excitation circuitry for supplying a transducer with an excitation signal to generate an object detection signal; and
 current monitor circuitry for monitoring current through the transducer.
The circuitry may further comprise:
 first processing circuitry configured to:
  receive a first signal indicative of a current through the transducer and a second signal indicative of the excitation signal;
  process the first and second signals; and
  output a third signal based on the processing of the first and second signals.
The first processing circuitry may be configured to perform one or more of:
 echo cancellation;
 deconvolution; and
 calculation of a statistical metrics.
The first signal may comprise the current through the transducer.
The second signal may comprise the excitation voltage.
The first processing circuitry may comprise detection circuitry configured to generate a detection signal indicative of detection of an echo or reflection, from an object, of the ultrasonic object detection signal based on the processing of the first and second signals.
The first processing circuitry may further comprise direct path removal circuitry configured to attenuate a component of the first signal caused by the excitation signal.
The direct path removal circuitry may comprise one or more of:
 adaptive filtering circuitry;
 least squares filtering circuitry; and
 echo cancellation circuitry.
The detection circuitry may comprise second processing circuitry configured to detect an echo or reflection of the object detection signal based on statistical metrics.
The second processing circuitry may be configured to determine one or more of:
 a statistical distance $d_{ks}$ between the transducer current signal and a reference signal based on a Kolmogorov-Smirnov (KS) test;
 a Wasserstein 1 distance $d_{w1}$ between the transducer current signal and a reference; and
 a Wasserstein 2 distance $d_{w2}$ between the transducer current signal and a reference signal.
The detection circuitry may comprise first pre-filter circuitry configured to attenuate a signal component of the first signal that is related to a voltage across the transducer during an excitation phase and a ring-out phase of operation of the circuitry and to output a pre-filtered version of the first signal to the processing circuitry.
The first pre-filter circuitry may be configured to receive the signal indicative of the excitation signal and the first signal and to correlate a version of the excitation signal with the first signal to generate the pre-filtered version of the first signal.
The detection circuitry may comprise second pre-filter circuitry configured to attenuate a signal component of the first signal that is related to a voltage across the transducer during an excitation phase and a ring-out phase of operation of the circuitry and to output a pre-filtered version of the first signal to the processing circuitry.
The second pre-filter circuitry may be configured to receive the second signal and a reference signal and to correlate a version of the excitation signal with the first current signal.
The detection circuitry may comprise second processing circuitry configured to perform a deconvolution of the first signal using the second signal to generate the detection signal.
The detection circuitry may comprise second processing circuitry configured to perform one or more machine learning techniques to generate the detection signal.
The circuitry may further comprise voltage detection circuitry configured to output a signal indicative of a voltage across the transducer.
The circuitry may further comprise downstream processing circuitry configured to receive an output signal from the first processing circuitry and to estimate, calculate or otherwise determine a quantity, value, metric or parameter related to the object based on the output signal from the first processing circuitry.
The downstream processing circuitry may be configured to determine the quantity, value, metric or parameter related to the object based on the output signal from the first processing circuitry or the signal indicative of the voltage across the transducer.
The downstream processing circuitry may be configured to estimate, calculate or otherwise determine the quantity, value, metric or parameter related to the object based on the output signal from the first processing circuitry during a ring-out phase of operation of the circuitry.
The downstream processing circuitry may be configured to determine the quantity, value, metric or parameter related to the object based on the signal indicative of the voltage across the transducer during a receive phase of operation of the circuitry.
The downstream processing circuitry may be configured to determine the quantity, value, metric or parameter related to the object based on both the signal indicative of the voltage across the transducer and the output signal from the first processing circuitry during a receive phase of operation of the circuitry.

The current monitor circuitry may comprise a resistor.

The current monitor circuitry may comprise a reactive element.

The reactive element may comprise one or more of a capacitor and an inductor.

The current monitor circuitry may further comprise a bias resistor.

The object detection signal may comprise an ultrasonic signal, a RADAR signal, an optical signal, a seismic signal or a SONAR signal.

The transducer may comprise a piezoelectric transducer.

According to a second aspect, the invention provides a system comprising a piezoelectric transducer and circuitry according to the first aspect.

According to a third aspect, the invention provides an integrated circuit comprising circuitry according to the first aspect.

According to a fourth aspect, the invention provides an electronic device comprising an integrated circuit according to the third aspect.

According to a fifth aspect, the invention provides a vehicle kick sensor system comprising circuitry according to the first aspect.

According to a sixth aspect, the invention provides a vehicle comprising a kick sensor system comprising circuitry according to the first aspect.

According to a seventh aspect, the invention provides a car comprising a kick sensor system comprising circuitry according to the first aspect.

According to an eighth aspect, the invention provides object detection circuitry comprising:
  drive circuitry configured to receive a drive signal and to output an excitation voltage to a piezoelectric transducer to cause the piezoelectric transducer to generate an ultrasonic object detection signal;
  current monitor circuitry configured to output a monitored transducer current signal indicative of a current through the piezoelectric transducer; and
  processing circuitry configured to process the drive signal and the monitored transducer current signal and to output a detection signal based on the processing.

According to a ninth aspect, the invention provides circuitry for detecting the presence of an object based on an object detection signal output by a transducer, the circuitry comprising:
  voltage monitor circuitry configured to generate a monitored transducer voltage signal indicative of a voltage across the transducer;
  current monitor circuitry configured to generate a monitored transducer current signal indicative of a current through the transducer; and
  processing circuitry configured to receive the monitored transducer voltage signal and the monitored transducer current signal,
  wherein the processing circuitry is configured to output a signal indicative of a distance between the transducer and a detected object based on the monitored transducer current signal in a first phase of operation of the circuitry,
  and wherein the processing circuitry is configured to output a signal indicative of a distance between the transducer and a detected object based on the monitored transducer voltage signal in a second phase of operation of the circuitry.

According to a tenth aspect, the invention provides circuitry for detecting the presence of an object in a signal path of a signal transmitted by a transducer, the circuitry comprising:
  detection circuitry for detecting a transducer signal; and
  processing circuitry configured to receive the transducer signal and a reference signal and to determine a statistical metric based on the transducer signal and the reference signal, the statistical metric indicative of the presence of an object in the signal path.

According to an eleventh aspect, the invention provides circuitry comprising:
  excitation circuitry for supplying a transducer with an excitation signal to generate a detection signal; and
  current monitor circuitry for monitoring current through the transducer.

The monitored current through the transducer may be generated by the detection signal.

The monitored current through the transducer may be generated by the excitation signal.

The monitored current through the transducer may be generated by the excitation signal and the detection signal.

The detection signal may be an object detection signal.

According to a twelfth aspect, the invention provides a module comprising:
  a transducer for receiving an excitation signal and generating a detection signal in response to the excitation signal and for receiving a reflected version of the detection signal;
  circuitry for generating the excitation signal; and
  circuitry for monitoring current through the transducer.

The monitored current through the transducer may be generated by the reflected version of the detection signal.

The monitored current through the transducer may be generated by the excitation signal.

The monitored current through the transducer may be generated by the excitation signal and the reflected version of the detection signal.

The reflected version of the detection signal may be an object detection signal.

The transducer and the circuitry may be electrically and mechanically connected to a substrate.

The substrate may comprises a printed circuit board.

According to a thirteenth aspect, the invention provides a method for detection of an object comprising:
  supplying a transducer with an excitation signal to generate an object detection signal; and
  monitoring current through the transducer.

According to a fourteenth aspect, the invention provides an object detection method comprising:
  receiving a drive signal and outputting an excitation voltage to a piezoelectric transducer to cause the piezoelectric transducer to generate an ultrasonic object detection signal;
  providing a monitored transducer current signal indicative of a current through the piezoelectric transducer; and
  processing the drive signal to the monitored transducer current signal and providing a detection signal based on the processing.

According to a fifteenth aspect, the invention provides a method for detecting the presence of an object based on an object detection signal output by a transducer, the method comprising:

generating a monitored transducer voltage signal indicative of a voltage across the transducer;

generating a monitored transducer current signal indicative of a current through the transducer; and during a first phase of operation, processing the monitored transducer voltage signal and the monitored transducer current signal to generate a signal indicative of a distance between the transducer and a detected object based on the monitored transducer current signal, during a second phase of operation, generating a signal indicative of a distance between the transducer and a detected object based on the monitored transducer voltage signal.

According to a sixteenth aspect, the invention provides a method for detecting the presence of an object in a signal path of a signal transmitted by a transducer, the method comprising:

detecting a transducer signal; and processing the transducer signal and a reference signal to determine a statistical metric based on the transducer signal and the reference signal, the statistical metric indicative of the presence of an object in the signal path.

BRIEF DESCRIPTION OF THE DRAWINGS

Embodiments of the invention will now be described, strictly by way of example only, with reference to the accompanying drawings, of which:

FIG. 7 is a schematic diagram illustrating example current monitor circuitry for the circuitry of FIG. 4;

FIG. 8 is a schematic diagram illustrating alternative example current monitor circuitry for the circuitry of FIG. 4; and FIG. 9 is a schematic diagram illustrating further alternative example current monitor circuitry for the circuitry of FIG. 4.

DETAILED DESCRIPTION

Figure 1:
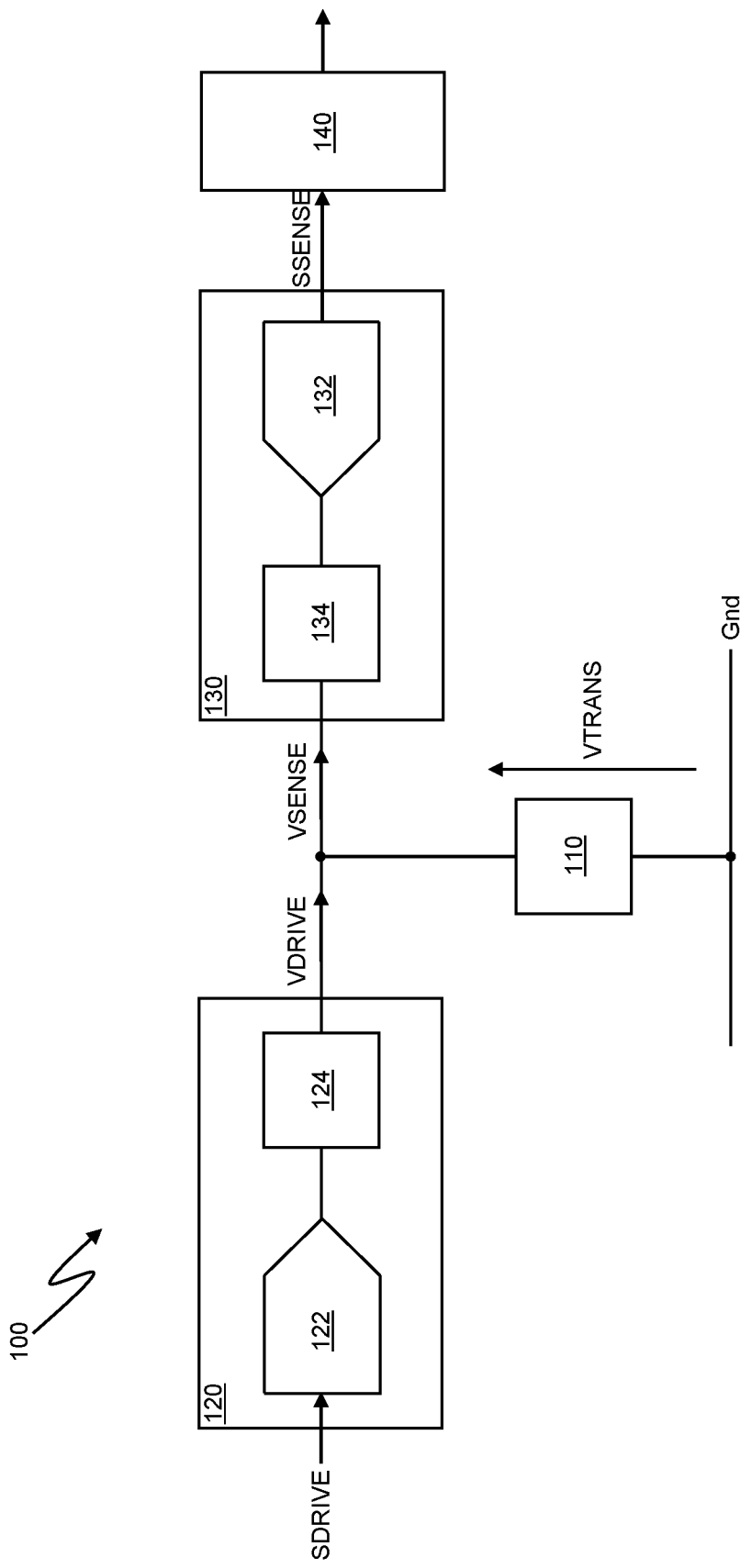
FIG. 1 is a schematic diagram illustrating typical object detection circuitry.

Referring first to FIG. 1, typical circuitry for object detection is shown generally at 100. The circuitry 100 is configured to provide an excitation voltage VDRIVE to a transducer 110, which may be, for example, a piezoelectric transducer, to cause the transducer 110 to generate an object detection signal, which may be, for example, an ultrasonic signal. The circuitry 100 is further configured to sense a voltage VSENSE that develops across the transducer 110 as a result of a reflection or echo of the transmitted object detection signal.

The circuitry 100 includes transmit side circuitry 120, which in the illustrated example includes a digital to analogue converter (DAC) 122 and transmit controller circuitry 124. The DAC 122 is operative to convert a digital drive signal SDRIVE into an analogue excitation voltage VDRIVE suitable for driving the transducer 110, which then generates the object detection signal. The transmit controller circuitry 124 is operative to enable or disable the transmit side circuitry 120, e.g. by selectively coupling the transmit side circuitry 120 to, or decoupling the transmit side circuitry 120 from, the transducer 110.

The circuitry 100 further includes receive side circuitry 130, which in the illustrated example includes an analogue to digital converter (ADC) 132 and receive controller circuitry 134. The ADC 132 is operative to convert an analogue echo detection voltage VSENSE generated by the transducer 110 when it is stimulated by a reflection or echo of the transmitted object detection signal into a digital signal SSENSE for processing by downstream processing circuitry 140. The receive controller circuitry 134 is operative to enable or disable the receive side circuitry 130, e.g. by selectively coupling the receive side circuitry 130 to, or decoupling the receive side circuitry 130 from, the transducer 110.

The downstream processing circuitry 140 is configured to process the digital signal SSENSE to estimate, calculate, or otherwise determine a quantity, value, metric, parameter or the like associated with an object that reflected the transmitted object detection signal, e.g. the distance between the transducer 110 and the object, based on a time interval between transmission of the object detection signal by the transducer 110 and detection of an echo or reflection of the object detection signal, as represented by the digital signal SSENSE.

In operation of the circuitry 100, the transmit side circuitry 120 is enabled by the transmit controller circuitry 124 and the analogue drive voltage VDRIVE based on the digital drive signal SDRIVE is output to the transducer 110, which in turn generates and transmits an object detection signal (e.g. an ultrasonic signal such as a chirp or series of chirps, or a pulse or series of pulses) based on the excitation voltage VDRIVE.

Once the object detection signal has been transmitted by the transducer, the transmit side circuitry 120 is disabled by the transmit controller circuitry 124 and the receive side circuitry 130 is enabled by the receive controller circuitry 134, to enable detection of reflections or echoes of the object detection signal by the receive side circuitry 130. When the transducer 130 is mechanically stimulated by a reflection or echo of the object detection signal, an analogue echo detection voltage VSENSE develops across the transducer 110. This echo detection voltage VSENSE is converted into a digital signal SSENSE by the ADC 132, for downstream processing by the processing circuitry 140, as described above.

Figure 2:
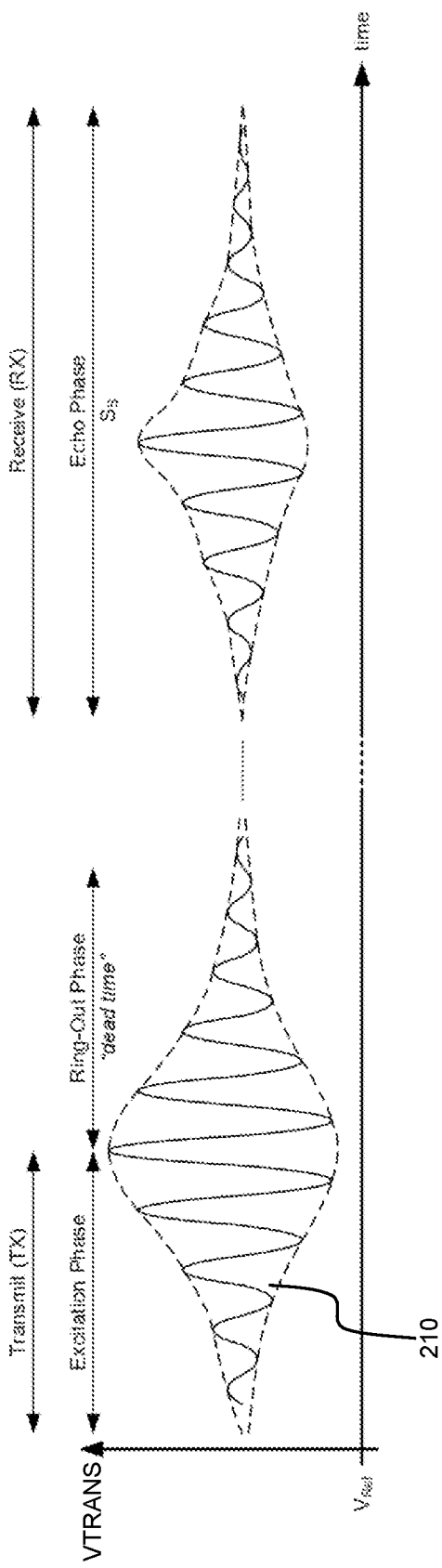
FIG. 2 illustrates the timing of transmission of an object detection signal by a transducer and reception of an echo or reflection signal by the transducer.

FIG. 2 illustrates the timing of the transmission of the object detection signal and reception of an echo or reflection signal by the transducer 110. It is to be noted that the signals shown in FIG. 2 are for illustrative purposes only, and are not necessarily representative of signals that may be present during operation of a practical implementation of the circuitry described above with reference to FIG. 1.

As can be seen in FIG. 2, during an excitation phase of operation of the circuitry 100, in which the transmit side circuitry 120 is enabled to supply the excitation voltage VDRIVE to the transducer 110, the amplitude of a voltage VTRANS across the transducer 110 increases to a peak value. When the transmit side circuitry 120 is disabled, which may be after a single cycle of the excitation voltage at peak amplitude, as shown in FIG. 2, or after multiple cycles of the excitation voltage at peak amplitude, the voltage 210 across the transducer 110 decays over the duration of a ring-out phase of operation of the circuitry 100.

When an echo of the transmitted object detection signal (from an object in the path of the object detection signal) is incident upon the transducer 110 during an echo phase of operation of the circuitry 100, the amplitude of the voltage across the transducer 110 increases as the transducer 110 is mechanically stimulated by the echo. The receive side circuitry 130 is enabled, at a time after the end of the ring-out phase, to commence a receive phase to detect such echoes.

Figure 3:
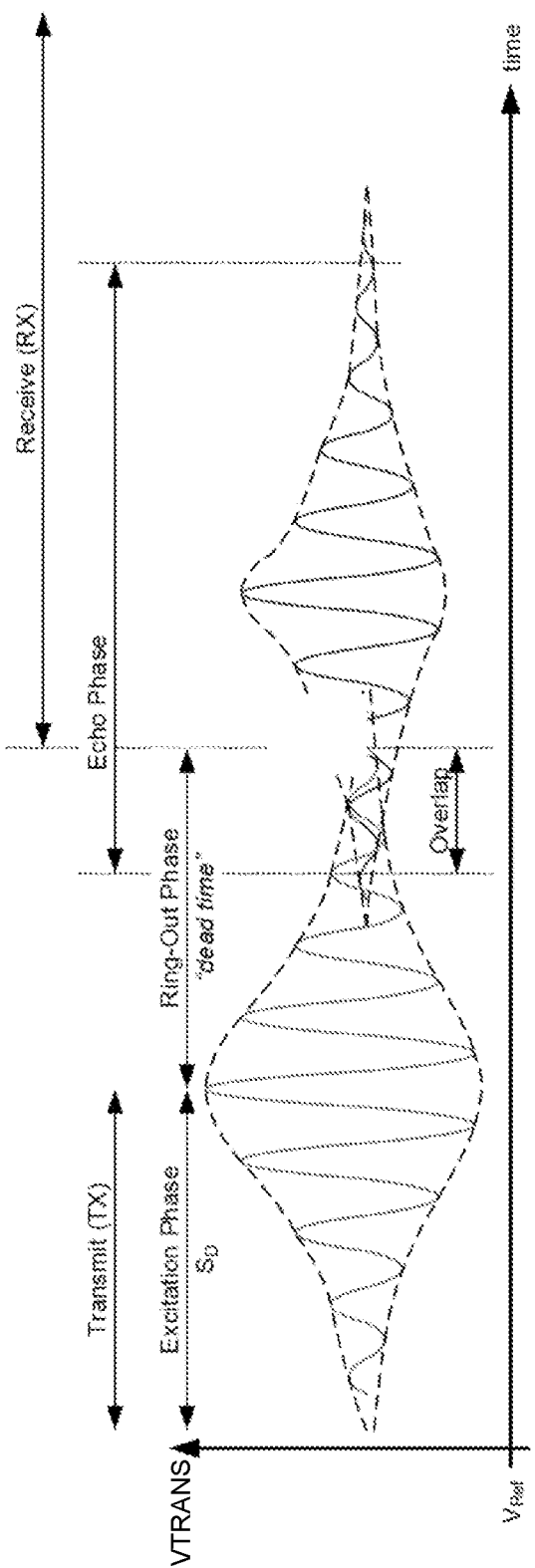
FIG. 3 illustrates an overlap between a ring-out time of a transmitted object detection signal by a transducer and reception of an echo or reflection signal by the transducer.

As will be appreciated, the time at which the echo of the transmitted object detection signal is received at the transducer 110 is dependent upon the distance of the object from the transducer 110, and it is possible that the echo phase may not coincide with the receive phase, i.e., echoes arising from objects that are close to the transducer 110 could arrive at the transducer 110 before the start of the receive phase, e.g. during the ring-out phase, as illustrated in FIG. 3. Such echoes will not be detected by the circuitry 100 of FIG. 1, however, because the receive side circuitry 130 is disabled until after the end of the ring-out phase.

Figure 4:
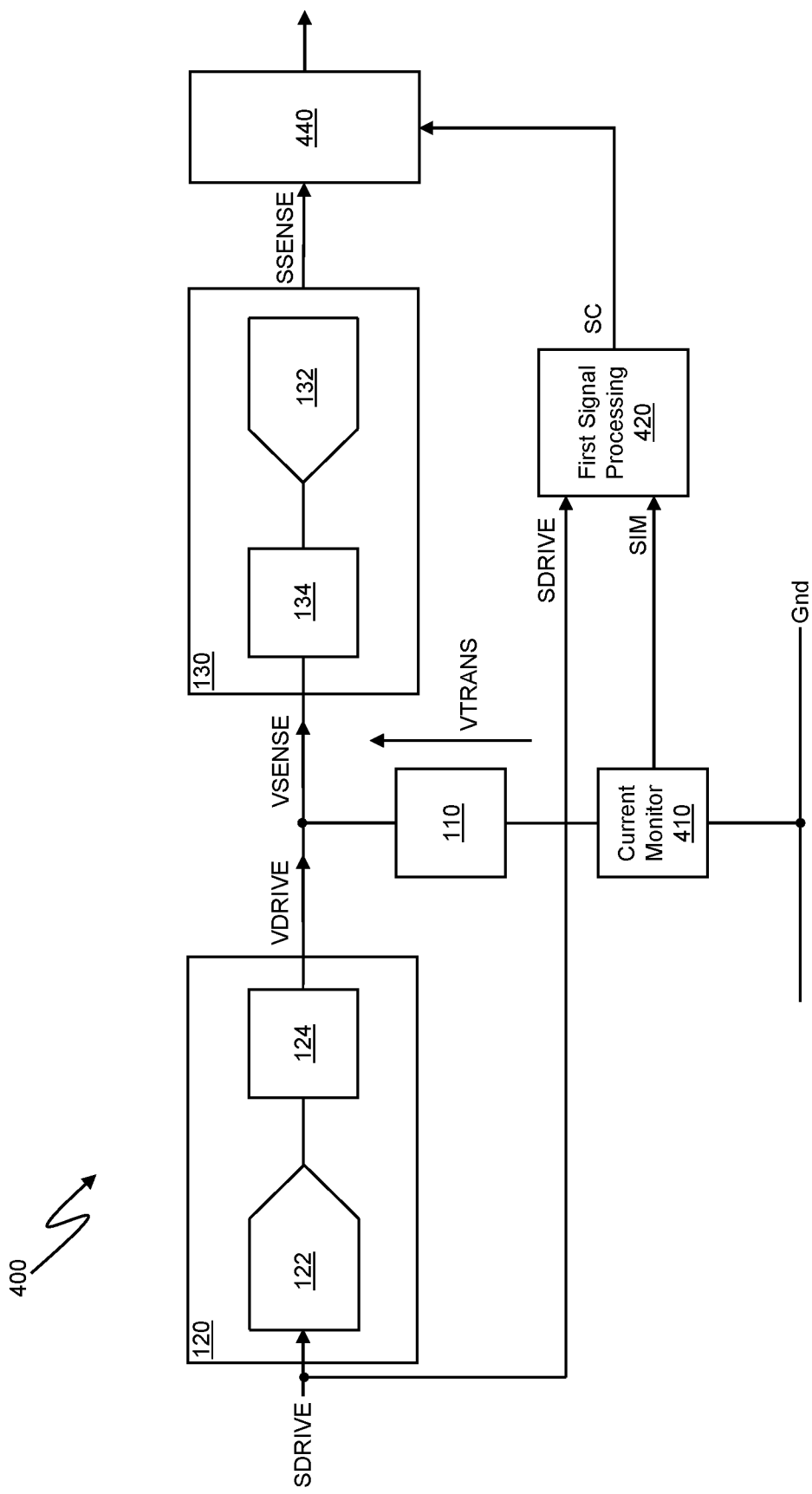
FIG. 4 is a schematic diagram illustrating circuitry according to an aspect of the present disclosure.

FIG. 4 is a schematic representation of circuitry according to an aspect of the present disclosure. The circuitry, shown generally at 400 in FIG. 4, includes a number of features in common with the circuitry 100 of FIG. 1. Such common features are denoted by common reference numerals and will not be described again in detail here.

The circuitry 400 of FIG. 4 includes current monitor circuitry 410, in series with the transducer 110, for monitoring a current through the transducer 110. The current monitor circuitry 410 permits the current through the transducer 110 to be monitored while the transducer 110 is receiving the excitation voltage VDRIVE. The ability to monitor the current through the transducer 110 while it is being driven with the excitation voltage VDRIVE offers a number of benefits, some of which will be discussed below.

The current monitor circuitry 410 is configured to output a monitored transducer current signal SIM, indicative of a current through the transducer 110, to a first input of first signal processing circuitry 420. The monitored transducer current signal SIM may be, for example, a digital signal indicative of the current through the transducer 110. A second input of the first signal processing circuitry 420 is coupled to an output of the DAC 122 so as to receive the drive signal SDRIVE that is input to the transmit side circuitry 120.

The first signal processing circuitry 420 is operative to process (e.g. compare or analyse) the monitored transducer current signal SIM and the drive signal SDRIVE, and to output a signal SC indicative of detection of an echo or reflected signal based on the processing. The first signal processing circuitry 420 may be operative to perform one or more signal processing operations such as echo cancellation, deconvolution, and calculation of statistical metrics such as distance metrics to generate and output the signal SC indicative of detection of an echo or reflected signal. The first signal processing circuitry 420 may comprise, for example, a microprocessor, a microcontroller, a state machine, an ASIC (application specific integrated circuit) or an FPGA (field programmable gate array), or any other circuitry suitable for performing the processing operations described herein.

The circuitry 400 may further include downstream processing circuitry 440 configured to receive the signal SC output by the first signal processing circuitry 420 and the signal SSENSE output by the receive side circuitry 130, and to estimate, calculate or otherwise determine a quantity, value, metric, parameter or the like associated with an object that reflected the transmitted object detection signal, e.g. the distance between the transducer 110 and the object, based on the signal SSENSE and/or the signal SC. The downstream processing circuitry 440 may comprise, for example, a microprocessor, a microcontroller, a state machine, an ASIC (application specific integrated circuit) or an FPGA (field programmable gate array), or any other circuitry suitable for performing the processing operations described herein.

During the excitation phase of operation, the current through the transducer 110 is dependent upon the voltage across the transducer 110 and the impedance of the transducer 110. The voltage across the transducer 110 during the excitation phase is equal to the excitation voltage VDRIVE (with perhaps some small additional components arising from noise, external physical stimuli on the transducer 110 etc.).

Following the excitation phase, the current through the transducer 110 is still dependent upon the voltage across the transducer 110 and the impedance of the transducer 110, but the voltage across the transducer 110 will have a component arising from any residual voltage from the excitation signal VDRIVE during the ring-out phase, and another component arising as a result of any physical stimulation of the transducer 110 by an echo or reflection of the transmitted object detection signal that is incident upon the transducer 110.

Thus, by processing the excitation signal SDRIVE and the monitored transducer current signal SIM, it is possible to identify and cancel or disregard a component of the monitored transducer current that arises due to the excitation signal VDRIVE, so as to identify any component of the monitored transducer current that arises as a result of an echo or reflection of the transmitted object detection signal, thus to determine whether an echo or reflection of the transmitted object detection signal is incident upon the transducer 110. The presence of an object can therefore be detected, even during the ring-out phase or possibly even earlier, during the excitation phase. Thus the circuitry 400 permits earlier object detection than the circuitry 100 of FIG. 1.

The downstream processing circuitry 440 may be configured to estimate, calculate or otherwise determine a quantity, value, metric or parameter such as a distance between the transducer 110 and the detected object based on the signal SC at least during the ring-out phase, and based on the signal SSENSE during the receive phase.

Thus, during the ring-out phase, the downstream processing circuitry 440 may determine a time interval between transmission of the object detection signal by the transducer 110 and detection of an echo or reflection based on the signal SC. A distance between the transducer and the detected object can be determined or estimated based on the determined time interval.

During the receive phase, the downstream processing circuitry 440 may determine a time interval between transmission of the object detection signal by the transducer 110 and detection of an echo or reflection based on the signal SSENSE. The determined time interval may then be used by the downstream processing circuitry 440 to determine the distance between the transducer 110 and the detected object.

Alternatively, the downstream processing circuitry 440 may be configured to use both the signal SSENSE and the signal SC during the receive phase to estimate, calculate or otherwise determine the quantity, value, metric or parameter (but to use only the signal SC during the ring-out phase). For example, during the receive phase, the downstream processing circuitry 440 may determine a first time interval between transmission of the object detection signal by the transducer 110 and detection of an echo or reflection based on the signal SSENSE, and may verify that an object has been detected using the signal SC, e.g. by comparing the first time interval to a corresponding second time interval determined based on the signal SC and detecting that the second time interval is within some threshold value of the first time interval. If the object detection is verified, the downstream processing circuitry 440 may then determine the distance between the transducer and the detected object based on the first time interval, the second time interval or a combination (e.g. an average) of the first and second time intervals.

In some examples the transmit control circuitry 124 may output a signal to the downstream processing circuitry 440 when the transmit side circuitry 120 is disabled at the end of the excitation phase, to notify the downstream processing circuitry 440 that the ring-out phase has started. In response to this signal the downstream processing circuitry 440 may select the signal SC for use in estimating, calculating or otherwise determining the quantity, value, metric or parameter (e.g. the distance between the transducer 110 and the detected object). Alternatively the downstream processing circuitry 440 may be configured to determine the start of the ring-out phase based on the signal SSENSE, e.g. by monitoring an envelope of the signal SSENSE.

The downstream processing circuitry 440 may be configured to determine the end of the ring-out phase based on the signal SSENSE (e.g. by monitoring the envelope to the signal SSENSE), or by determining the end of a predetermined time period after receiving the signal indicative of the start of the ring-out phase. On determining the end of the ring-out phase, the downstream processing circuitry 440 may select the signal SSENSE for use (either alone or in combination with the signal SC) in estimating, calculating or otherwise determining the quantity, value, metric or parameter (e.g. the distance between the transducer 110 and the detected object).

The transmit side circuitry 120, receive side circuitry 130, current monitor circuitry 410 and first signal processing circuitry 420 may be implemented as a single integrated circuit (IC), with the transducer 110 being provided externally of the IC. The downstream processing circuitry 440 may also be implemented in the IC, or alternatively may be provided externally of the IC, e.g. in a separate IC.

Figure 5:
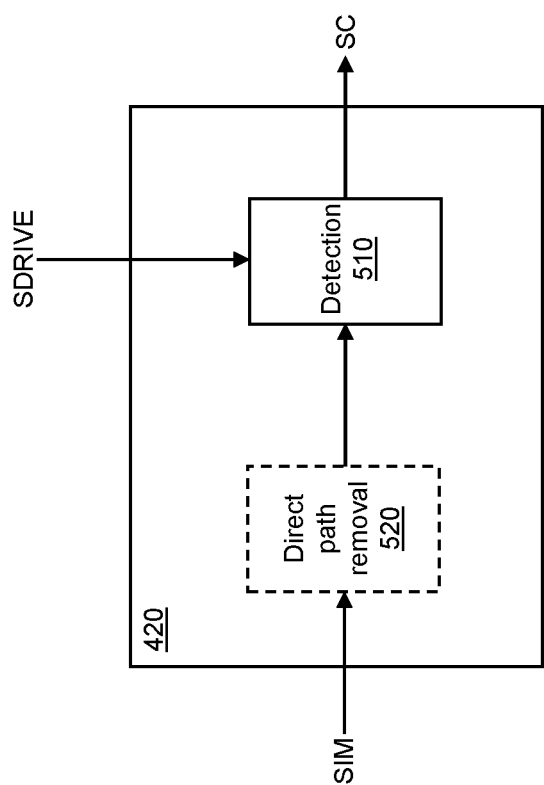
FIG. 5 is a schematic diagram illustrating example comparator circuitry of the circuitry of FIG. 4.

FIG. 5 is a schematic illustration of example first signal processing circuitry 420. The first signal processing circuitry 420 includes detection circuitry 510, which is configured to receive the excitation signal SDRIVE and the monitored transducer current signal SIM (or a version thereof), and to output a detection signal SC indicative of detection (or not) of an echo or reflection of the transmitted object detection signal.

The first signal processing circuitry 420 may, optionally, also include direct path removal circuitry 520, operative to remove or attenuate components of the monitored transducer current signal SIM that arise as a result of the excitation voltage VDRIVE, i.e. components of the monitored transducer current signal SIM that are related to the voltage VTRANS across the transducer 110 during the excitation phase and the ring-out phase. The direct path removal circuitry 520 may comprise, for example, adaptive filtering circuitry, and/or least squares filtering circuitry and/or echo cancellation circuitry or the like.

By filtering out or attenuating such signal components, the version of the monitored transducer current signal SIM that is input to the detection circuitry 510 should be dominated by signal components related to a detected echo or reflection of the transmitted object detection signal.

Figure 6:
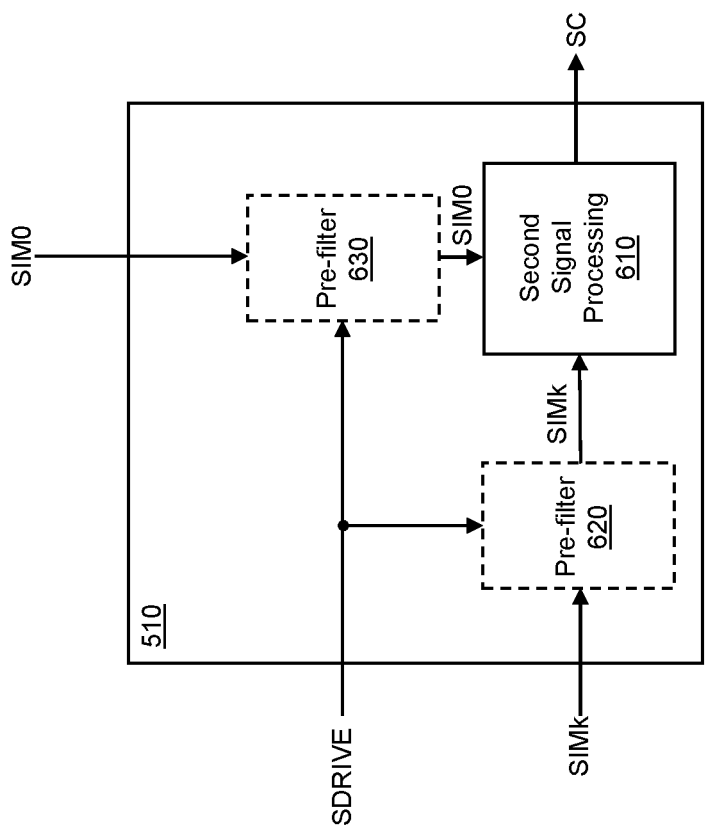
FIG. 6 is a schematic diagram illustrating example processing circuitry of the comparator circuitry of FIG. 5.

FIG. 6 is a schematic illustration of example detection circuitry 510. The detection circuitry 510 includes second signal processing circuitry 610, which is configured to receive a reference signal SIM0 (or a pre-filtered version thereof) and a single time trace SIMk (or a pre-filtered version thereof) of the monitored transducer current signal SIM, and to output the detection signal SC. The second signal processing circuitry 610 may comprise, for example, a microprocessor, a microcontroller, a state machine, an ASIC (application specific integrated circuit) or an FPGA (field programmable gate array), or any other circuitry suitable for performing the processing operations described herein.

The reference signal SIM0 is indicative of the monitored transducer current in the absence of any echo or reflection of the transmitted object detection signal. Thus the reference signal SIM0 represents a background condition in which the object detection signal is not reflected by any object in its path.

The detection circuitry may, optionally, also include first pre-filter circuitry 620, for pre-filtering the monitored transducer current signal SIMk to (further) attenuate signal components of the monitored transducer current signal SIMk that are related to the voltage VTRANS across the transducer 110 during the excitation phase and the ring-out phase. The first pre-filter circuitry 620 may comprise matched filtering circuitry configured to receive the excitation signal SDRIVE and the monitored transducer current signal SIMk and to correlate a version of the excitation signal with the monitored transducer current signal SIMk, thus improving the signal to noise ratio of the transducer current signal SIM.

The detection circuitry may, optionally, also include second pre-filter circuitry 630, for pre-filtering the reference signal SIM0 to attenuate signal components of the reference signal SIM0 that are related to the voltage VTRANS across the transducer 110 during the excitation phase and the ring-out phase. The second pre-filter circuitry 630 may comprise matched filtering circuitry configured to receive the excitation signal SDRIVE and the reference signal SIM0 and to correlate a version of the excitation signal with the reference signal SIM0, thus improving the signal to noise ratio of the reference signal SIM0.

The second signal processing circuitry 610 is operative to receive the monitored transducer current signal SIMk (or a pre-filtered version thereof) and the reference signal SIM0 (or a pre-filtered version thereof) and to process the received signals to generate the detection signal SC.

For example, the second signal processing circuitry 610 may be configured to perform processing based on one or more statistical metrics to generate the detection signal SC.

In some examples, the second signal processing circuitry 610 may be configured to perform a Kolmogorov-Smirnov (KS) test to determine a statistical distance $d_{ks}$ between the monitored transducer current signal SIMk and the reference signal SIM0 according to the function:

$$d_{ks} = \max\{|fset_i - fset_i|\},$$

where $fset_1$ is the cumulative distribution function of SIM0 and $fset_2$ is the cumulative distribution function of SIMk.

In some examples the second signal processing circuitry 610 may be configured to determine a Wasserstein 1 distance $d_{w1}$ and/or a Wasserstein 2 distance $d_{w2}$ between the monitored transducer current signal SIMk and the reference signal SIM0 according to the functions:

$$d_{w1} = \int |fset_1 - fset_2| dt$$

$$d_{w2} = \sqrt{\int (fset_1 - fset_2)},$$

where again $fset_1$ is the cumulative distribution function of SIM0 and $fset_2$ is the cumulative distribution function of SIMk.

The second signal processing circuitry 610 may then compare the statistical distance (e.g. $d_{ks}$, $d_{w1}$ or $d_{w2}$) to a threshold to determine whether an echo or reflection of the transmitted object detection signal has been detected and thus whether an object has been detected.

Alternatively, the processing circuitry may be configured to perform a deconvolution of the monitored transducer current signal SIM using the excitation signal SDRIVE to determine whether an echo or reflection of the transmitted object detection signal is represented in or by the monitored transducer current signal SIM.

The monitored transducer current signal SIM contains a component arising from the excitation voltage VDRIVE and a component arising as a result of an echo or reflection received at the transducer 110. The monitored transducer current signal SIM may therefore be regarded as a convolution of the known excitation signal SDRIVE and an unknown echo signal SECHO, i.e. SIM=SDRIVE*SECHO. To determine the unknown echo signal SECHO, a simple deconvolution can be used, as follows:

$$SECHO = F^{-1}\left\{\frac{F(SIM)}{F(SDRIVE)}\right\}$$

(Note that SECHO, SIM and SDRIVE are time-domain signals).

The result of the simple deconvolution may be ill-conditioned, for example, if there are any zeroes or noise in F{SDRIVE}. To improve the results, a regularised deconvolution can be performed, e.g. using a Tikhonov regularisation, as follows:

$$SECHO = F^{-1}\left\{\frac{F(SDRIVE) \cdot F^*(SIM)}{F(SDRIVE)F^*(SDRIVE) + \lambda F(SDRIVE) \cdot F^*(SDRIVE)}\right\}$$

As a further alternative, the second signal processing circuitry 610 may be configured to perform one or more machine learning techniques such as linear discriminant analysis to determine whether an echo or reflection of the transmitted object detection signal is represented in or by the monitored transducer current signal SIMk.

The second signal processing circuitry 610 may be configured to implement a multilayer perceptron (MLP), deep neural network (DNN) or the like with appropriate activation functions to detect an echo or reflection of the transmitted object detection signal based on the monitored transducer current signal SIMk.

Turning now to FIG. 7, example circuitry for use as the current monitoring circuitry 410 is shown generally at 700.

The circuitry, shown generally at 700 in FIG. 7, includes a sense resistor 710 of known value coupled in series between the transducer 110 and a ground (or other reference voltage) supply rail. To avoid excessive attenuation of the excitation signal VDRIVE the sense resistor 710 should have a small resistance. A voltage drop across the sense resistor 710 is indicative of the instantaneous current through the sense resistor 710 and thus also the current through the transducer 110.

The circuitry 700 further includes a differential analogue to digital converter (ADC) 720 coupled in parallel with the sense resistor 710, such that a first input of the ADC 720 is coupled to a first terminal of the sense resistor 710, and a second input of the ADC 720 is coupled to a second terminal of the sense resistor 710. Thus the ADC 720 generates the digital output signal SIM, which is indicative of the current through the transducer 110.

FIG. 8 illustrates alternative example circuitry for use as the current monitoring circuitry 410.

The circuitry, shown generally at 800 in FIG. 8, includes a sense capacitor 810 coupled in series between the transducer 110 and a ground (or other reference voltage) supply rail. To avoid excessive attenuation of the excitation signal VDRIVE the sense capacitor 810 should have a large capacitance. A differential analogue to digital converter (ADC) 820 is coupled in parallel with the capacitor 810, such that a first input of the ADC 820 is coupled to a first terminal of the capacitor 810, and a second input of the ADC 820 is coupled to a second terminal of the capacitor 810. The ADC 820 generates the digital output signal SIM, which is indicative of the current through the transducer 110.

As will be appreciated, the combination of the capacitance of the transducer 110 and the sense capacitance 810 forms a capacitive voltage divider. FIG. 9 illustrates a modified version of the circuitry 800 in which a resistive potential divider comprising first and second resistors 832, 834 is coupled in parallel with the series combination of the transducer 110 and the sense capacitor 810, with a node 836 intermediate the first and second resistors 832, 834 being coupled to a node 838 intermediate the transducer 110 and the sense capacitor 810, to provide a bias voltage.

In alternative examples an inductor may be used in place of the capacitor 810 in the current monitoring circuitry 410, or alternatively a combination of an inductor and a capacitor may be used in place of the capacitor 810. Thus the current monitoring circuitry may comprise a resistive element, as shown in FIG. 7, or may comprise reactive element, which may comprise a capacitor, an inductor, or a capacitor and an inductor.

As will be apparent from the discussion above, by sensing current through the transducer 110, echoes or reflections of the transmitted object detection signal can be detected more quickly than in the circuitry 100 of FIG. 1, because it is not necessary to wait until after the ring-out phase before detection of such echoes or reflections can be performed. Thus the circuitry 400 of FIG. 4 permits faster object detection than the circuitry 100 of FIG. 1.

The circuitry 400 may be used in a variety of object detection and range finding applications. For example, the circuitry 400 may be used for range-finding in a parking assist system for vehicles such as cars, or in a "kick detect" system for permitting access to a vehicle's luggage compartment or another area such as a passenger compartment, engine bay or the like by detecting the presence of a user's foot, leg or other body part in a predefined region around the vehicle, e.g. under the rear bumper.

The discussion above mentions the use of an ultrasonic signal as an object detection signal. Those of ordinary skill in the art will appreciate that the term "ultrasonic signal" is used herein to refer to a signal with a frequency outside (e.g. above) the limits of normal human hearing, e.g. a signal with a frequency greater than 20 kHz.

Those of ordinary skill in the art will further appreciate that the principles and techniques disclosed herein are equally suitable for use with object detection signals of other types and frequencies, and for a number of object detection and range finding applications.

For example, the disclosed principles and techniques may be used in non-contact level measurement applications (using an ultrasonic signal as the object detection signal), RADAR applications (using a RADAR signal, e.g. having a frequency in the range 5 MHz-130 GHz), optoacoustics applications (using an optical signal as the object detection signal), seismic monitoring and analysis applications and hydroacoustic applications. The frequency (or frequency range) of the object detection signal may be selected according to the application, and suitable frequencies or frequency ranges for the object detection signal will be readily apparent to those skilled in the relevant art.

The present disclosure extends to a system comprising the transmit side circuitry 120, receive side circuitry 130, current monitor circuitry 410 and first signal processing circuitry 420 (e.g. integrated into a single IC) and a piezoelectric transducer 110, mounted on a suitable substrate such as a printed circuit board (PCB) or in a suitable package. The system may further include the downstream processing circuitry 440, which may be provided in a single IC with the transmit side circuitry 120, receive side circuitry 130, current monitor circuitry 410 and first signal processing circuitry 420, or may be provided separately, e.g. in a separate IC suitably mounted or packaged.

The present disclosure further extends to a module comprising a substrate such as a printed circuit board (PCB) to which are coupled (electrically and/or mechanically) a transducer 110 (e.g. a piezoelectric transducer, optical transducer or the like) for receiving an excitation signal VDRIVE and generating a detection signal in response to the excitation signal, and for receiving a reflected version of the detection signal. The module further comprises circuitry 120 for generating the excitation signal VDRIVE, e.g. based on a drive signal VDRIVE, and current monitor circuitry 410 for monitoring a current through the transducer 110. As described above, during an excitation phase the current through the transducer 110 is generated by the excitation signal, whereas during the receive phase a current through the transducer 110 may be generated by a reflected version of the detection signal. During a ring-out phase a at least a proportion of the current through the transducer 110 is generated by the excitation signal VDRIVE, and there may be a component of the current through the transducer 110 that is generated by a reflected version of the detection signal. The current monitor 410 may be operative to monitor the current through the transducer during the excitation phase, the receive phase and the ring-out phase.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product. In some instances the device could be a gaming device such as a games console, or a virtual reality (VR) or augmented reality (AR) device such as a VR or AR headset, spectacles or the like.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry comprising:
excitation circuitry for supplying a transducer with an excitation signal to generate a detection signal; and
current monitor circuitry for monitoring current through the transducer;
wherein the circuitry further comprises:
first processing circuitry configured to:
receive a first signal indicative of a current through the transducer and a second signal indicative of the excitation signal;
process the first and second signals; and
output a third signal based on the processing of the first and second signals.

2. The circuitry according to claim 1, wherein the first processing circuitry is configured to perform one or more of:
echo cancellation;
deconvolution; and
calculation of a statistical metric.

3. The circuitry according to claim 1, wherein the first processing circuitry comprises detection circuitry configured to generate a detection signal indicative of detection of an echo or reflection, from an object, of the detection signal based on the processing of the first and second signals.

4. The circuitry according to claim 3, wherein the detection circuitry comprises second processing circuitry configured to detect an echo or reflection of the detection signal based on a statistical metric, wherein the second processing circuitry is configured to determine one or more of:
a statistical distance $d_{ks}$ between the transducer current signal and a reference signal based on a Kolmogorov-Smirnov (KS) test;
a Wasserstein 1 distance $d_{w1}$ between the transducer current signal and a reference; and
a Wasserstein 2 distance $d_{w2}$ between the transducer current signal and a reference signal.

5. The circuitry according to claim 4, wherein the detection circuitry comprises first pre-filter circuitry configured to attenuate a signal component of the first signal that is related to a voltage across the transducer during an excitation phase and a ring-out phase of operation of the circuitry and to output a pre-filtered version of the first signal to the processing circuitry, wherein the first pre-filter circuitry is configured to receive the signal indicative of the excitation signal and the first signal and to correlate a version of the excitation signal with the first signal to generate the pre-filtered version of the first signal.

6. The circuitry according to claim 1, wherein the first processing circuitry further comprises direct path removal circuitry configured to attenuate a component of the first signal caused by the excitation signal, wherein the direct path removal circuitry comprises one or more of:
adaptive filtering circuitry;
least squares filtering circuitry; and
echo cancellation circuitry.

7. The circuitry according to claim 6, wherein the detection circuitry comprises second pre-filter circuitry configured to attenuate a signal component of the first signal that is related to a voltage across the transducer during an excitation phase and a ring-out phase of operation of the circuitry and to output a pre-filtered version of the first signal to the processing circuitry, wherein the second pre-filter circuitry is configured to receive the second signal and a reference signal and to correlate a version of the excitation signal with the first signal.

8. The circuitry according to claim 6, wherein the detection circuitry comprises second processing circuitry configured to:
perform a deconvolution of the first signal using the second signal to generate the detection signal; or
perform one or more machine learning techniques to generate the detection signal.

9. The circuitry according to claim 1, further comprising voltage detection circuitry configured to output a signal indicative of a voltage across the transducer.

10. The circuitry according to claim 9, further comprising downstream processing circuitry configured to receive an output signal from the first processing circuitry and to estimate, calculate or otherwise determine a quantity, value, metric or parameter related to an object based on the output signal from the first processing circuitry or the signal indicative of the voltage across the transducer.

11. The circuitry according to claim 10, wherein the downstream processing circuitry is configured to estimate, calculate or otherwise determine the quantity, value, metric or parameter related to the object based on:
the output signal from the first processing circuitry during a ring-out phase of operation of the circuitry; or
the signal indicative of the voltage across the transducer during a receive phase of operation of the circuitry; or
both the signal indicative of the voltage across the transducer and the output signal from the first processing circuitry during the receive phase of operation of the circuitry.

12. The circuitry according to claim 1, wherein the current monitor circuitry comprises:
a resistor; or
a reactive element comprising one or more of a capacitor and an inductor.

13. The circuitry according to claim 1, wherein the detection signal comprises an ultrasonic signal, a RADAR signal, an optical signal, a seismic signal or a SONAR signal.

14. The circuitry according to claim 1, wherein the transducer comprises a piezoelectric transducer.

15. The circuitry according to claim 1, further comprising a piezoelectric transducer.

16. An integrated circuit comprising:
a die; and
the circuitry according to claim 1, implemented within the die.

17. An electronic device comprising:
the circuitry according to claim 1; and
at least one other component.

18. A vehicle kick sensor system comprising:
the circuitry according to claim 1; and
at least one other component.

19. A vehicle comprising:
a kick sensor system comprising the circuitry according to claim 1; and
at least one other component.

20. Object detection circuitry comprising:
drive circuitry configured to receive a drive signal and to output an excitation voltage to a piezoelectric transducer to cause the piezoelectric transducer to generate an ultrasonic object detection signal;
current monitor circuitry configured to output a monitored transducer current signal indicative of a current through the piezoelectric transducer; and
processing circuitry configured to process the drive signal and the monitored transducer current signal and to output a detection signal based on the processing.

21. Circuitry for detecting the presence of an object in a signal path of a signal transmitted by a transducer, the circuitry comprising:
detection circuitry for detecting a transducer signal; and
processing circuitry configured to receive the transducer signal and a reference signal and to determine a statistical metric based on the transducer signal and the reference signal, the statistical metric indicative of the presence of an object in the signal path.

* * * * *